(12) United States Patent
Watanabe et al.

(10) Patent No.: US 11,819,975 B2
(45) Date of Patent: Nov. 21, 2023

(54) WORKPIECE PROCESSING APPARATUS INCLUDING A RESIN COATER AND A RESIN GRINDER

(71) Applicant: DISCO CORPORATION, Tokyo (JP)

(72) Inventors: Shinya Watanabe, Tokyo (JP); Ichiro Yamahata, Tokyo (JP); Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 135 days.

(21) Appl. No.: 16/216,291

(22) Filed: Dec. 11, 2018

(65) Prior Publication Data

US 2019/0198357 A1  Jun. 27, 2019

(30) Foreign Application Priority Data

Dec. 26, 2017  (JP) ................. 2017-249095

(51) Int. Cl.
| | | |
|---|---|---|
| *H01L 21/677* | (2006.01) | |
| *H01L 21/02* | (2006.01) | |
| *B24B 37/34* | (2012.01) | |
| *B24B 37/00* | (2012.01) | |
| *B24B 37/013* | (2012.01) | |
| *B24B 37/005* | (2012.01) | |
| *B24B 37/08* | (2012.01) | |

(Continued)

(52) U.S. Cl.
CPC ........... *B24B 37/00* (2013.01); *B24B 37/005* (2013.01); *B24B 37/013* (2013.01); *B24B 37/08* (2013.01); *B24B 49/03* (2013.01); *B24B 49/045* (2013.01); *B24B 49/12* (2013.01); *B24B 53/007* (2013.01); *H01L 21/6773* (2013.01); *H01L 21/67092* (2013.01); *H01L 21/67253* (2013.01); *H01L 21/78* (2013.01); *H01L 22/12* (2013.01); *B05C 9/12* (2013.01); *B05C 11/1005* (2013.01); *B24B 37/345* (2013.01); *B24B 53/017* (2013.01); *H01L 21/02013* (2013.01); *H01L 21/304* (2013.01)

(58) Field of Classification Search
CPC ..... B24B 37/013; B24B 37/00; B24B 37/005; H01L 21/67253; H01L 22/12; H01L 21/68764; H01L 21/68785; H01L 21/6715; B05C 9/12; B05C 11/1005; B05B 3/00
See application file for complete search history.

(56) References Cited

U.S. PATENT DOCUMENTS 7,119,908 B2 * 10/2006 Nomoto ................ B24B 37/013
356/504
7,175,505 B1 * 2/2007 Ko ...................... B24B 27/0023
451/5

(Continued)

FOREIGN PATENT DOCUMENTS

JP       2009043931 A     2/2009

*Primary Examiner* — Karl Kurple
(74) *Attorney, Agent, or Firm* — Greer, Burns & Crain, Ltd.

(57) ABSTRACT

A workpiece processing apparatus which coats a front surface of a workpiece with a resin, the workpiece having devices formed in regions demarcated by a plurality of planned dividing lines formed in a lattice pattern. The workpiece processing apparatus includes a cassette mounting base mounted with a cassette housing a plurality of workpieces, a resin coating unit that coats the front surface of the workpiece with the resin, a resin curing unit that cures the resin by applying an external stimulus to the coated resin, a resin grinding unit that flattens the cured resin by grinding the cured resin by a rotating grinding stone, and a conveying mechanism that conveys the workpiece between the units.

7 Claims, 2 Drawing Sheets

(51) Int. Cl.
  *B24B 49/03*   (2006.01)
  *B24B 49/12*   (2006.01)
  *B24B 53/007*  (2006.01)
  *B24B 49/04*   (2006.01)
  *H01L 21/67*   (2006.01)
  *H01L 21/78*   (2006.01)
  *H01L 21/66*   (2006.01)
  *B05C 11/10*   (2006.01)
  *B05C 9/12*    (2006.01)
  *H01L 21/304*  (2006.01)
  *B24B 53/017*  (2012.01)

(56) References Cited

U.S. PATENT DOCUMENTS

| | | | |
|---|---|---|---|
| 2002/0052169 A1 | 5/2002 | Vepa et al. | |
| 2002/0102920 A1 | 8/2002 | Vogtmann et al. | |
| 2009/0042488 A1* | 2/2009 | Sekiya | B24B 7/228 451/41 |
| 2010/0021688 A1 | 1/2010 | Katoh et al. | |
| 2013/0302969 A1* | 11/2013 | Priewasser | H01L 21/82 438/458 |
| 2014/0014039 A1* | 1/2014 | Naito | H01L 21/68771 118/730 |
| 2014/0017824 A1* | 1/2014 | Iizumi | H01L 21/76819 438/16 |
| 2015/0013602 A1* | 1/2015 | Terada | H01L 21/67051 118/608 |
| 2015/0017880 A1* | 1/2015 | Nomura | G01B 11/0633 451/5 |
| 2015/0357199 A1 | 12/2015 | Kramer | |
| 2017/0244006 A1* | 8/2017 | Burrows | C23C 16/45523 |
| 2019/0148179 A1* | 5/2019 | Kikai | B08B 7/0057 134/1.3 |
| 2019/0198357 A1 | 6/2019 | Watanabe et al. | |
| 2019/0206673 A1* | 7/2019 | Watanabe | H01L 21/6715 |

* cited by examiner

WORKPIECE PROCESSING APPARATUS INCLUDING A RESIN COATER AND A RESIN GRINDER

BACKGROUND OF THE INVENTION

Field of the Invention

The present invention relates to a workpiece processing apparatus, and particularly to a workpiece processing apparatus capable of coating a workpiece with a resin.

Description of the Related Art

In a semiconductor device manufacturing process, a plurality of planned dividing lines are formed in a lattice pattern on a front surface of a workpiece, and a device such as an integrated circuit (IC), a large-scale integration circuit (LSI), or the like is formed in each of regions demarcated by the planned dividing lines. The workpiece is thinned to a predetermined thickness by grinding a back surface of the workpiece by grinding stones. The workpiece is thereafter divided along the planned dividing lines by a cutting apparatus or the like. Individual semiconductor device chips are thereby manufactured.

An existing method forms a resin film by coating a front surface of a workpiece with a resin cured by an ultraviolet ray. The resin film protects the devices on the front surface of the workpiece at a time of thinning the workpiece by grinding the back surface. The resin film is used instead of protecting the devices by attaching a protective tape to the workpiece for grinding the front surface of the workpiece (see Japanese Patent Laid-Open No. 2009-043931, for example).

SUMMARY OF THE INVENTION

However, when the front surface of the workpiece is coated with a liquid resin by spin coating or the like, the liquid resin is difficult to control. Thus, it is difficult to control a thickness of the coated resin on the front surface of the workpiece to a uniform desired thickness, and it is also difficult to flatten an exposed surface of the coated resin with high precision. Then, when the thickness of the coated resin is not a desired thickness, or when the exposed surface of the coated resin is not flattened with high precision, thickness precision of the workpiece at a time of performing grinding the workpiece is also decreased.

It is accordingly an object of the present invention to provide a workpiece processing apparatus that can make the thickness of a coated resin film a desired thickness and flatten the exposed surface of the resin film with high precision in a case where the resin film is formed by coating a workpiece with a resin by spin coating or the like.

In accordance with an aspect of the present invention, there is provided a workpiece processing apparatus which coats a front surface of a workpiece with a resin, the workpiece having a device formed in each of regions demarcated by a plurality of planned dividing lines formed in a lattice pattern, the workpiece processing apparatus including: cassette mounting means mounted with a cassette housing a plurality of workpieces; resin coating means coating the front surface of the workpiece with the resin; resin curing means curing the resin by applying an external stimulus to the coated resin; resin grinding means flattening the cured resin by grinding the cured resin by a rotating grinding stone; and conveying means conveying the workpiece between the cassette mounting means, the resin coating means, the resin curing means, and the resin grinding means.

Preferably, the resin coating means coats the front surface of the workpiece with the resin by a spin coating method.

Preferably, the workpiece processing apparatus according to the present invention measures a thickness of the resin after being ground, and transmits the measured thickness of the resin to a grinding apparatus in a next process, the grinding apparatus thinning the workpiece to a predetermined thickness by grinding a back surface of the workpiece.

According to the present invention, it is possible to make a thickness of a coated resin film a desired thickness and flatten an exposed surface of the resin film with high precision only within the workpiece processing apparatus.

Further, the thickness of the resin after being ground is measured, and the measured thickness of the resin is transmitted to the grinding apparatus in the next process, the grinding apparatus thinning the workpiece to a predetermined thickness by grinding the back surface of the workpiece. It is thereby possible to improve precision of finished thickness after grinding of the workpiece ground in the grinding apparatus in the next process.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
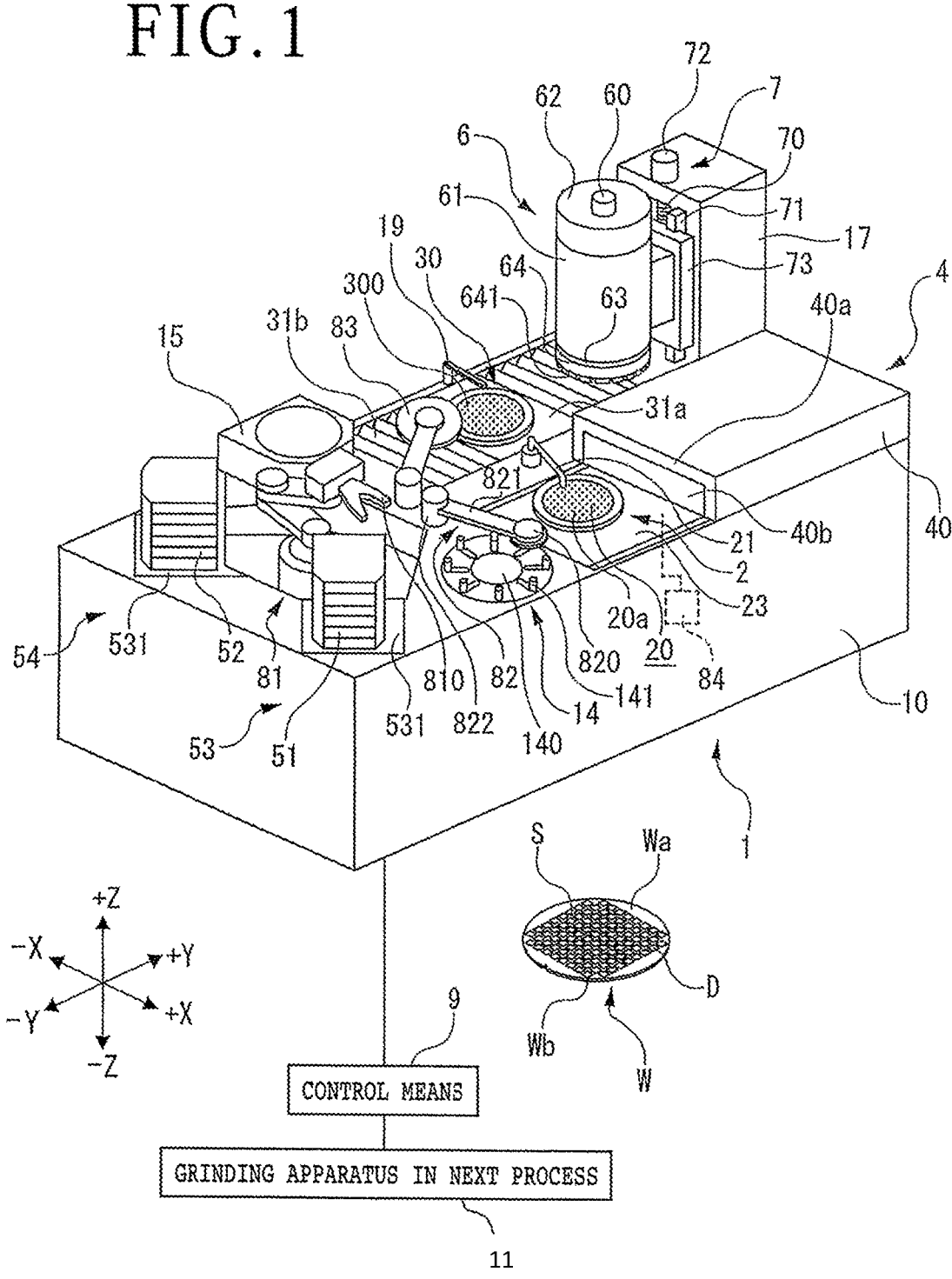
FIG. 1 is a perspective view illustrating an example of a processing apparatus.

A processing apparatus 1 according to the present invention illustrated in FIG. 1 is a processing apparatus that can coat a front surface Wa of a workpiece W with a resin, and grind the coated resin by grinding stones 641. Provided on a front side (−Y direction side) of a base 10 of the processing apparatus 1 are a first cassette 51 that has a plurality of layers of shelves formed therewithin and is capable of housing a plurality of workpieces W before resin coating in a form of shelves and a second cassette 52 that has a plurality of layers of shelves formed therewithin and is capable of housing a plurality of workpieces W after a coated resin is ground in a form of shelves. The first cassette 51 is mounted on first cassette mounting means 53 disposed in the base 10, and the second cassette 52 is mounted on second cassette mounting means 54 disposed in the base 10.

The plurality of workpieces W housed in the form of shelves within the first cassette 51 are each, for example, a semiconductor wafer that has silicon as a base material and whose external shape is a shape of a circular plate. A plurality of planned dividing lines S intersecting one another at a right angle are formed on a front surface Wa facing upward in FIG. 1. A device D such as an IC or the like is formed in each of regions demarcated in a lattice pattern by the planned dividing lines S. Incidentally, the workpiece W may be formed by gallium arsenide, sapphire, gallium nitride, silicon carbide, or the like other than silicon, and the external shape of the workpiece W may not be a circular shape but may be formed in a rectangular shape, for example. The feeding of workpieces W to the processing apparatus 1 is performed efficiently by mounting the first cassette 51 housing the plurality of workpieces W therewithin on the first cassette mounting means 53.

The first cassette mounting means 53 and the second cassette mounting means 54 have a similar configuration. Only the configuration of the first cassette mounting means 53 will therefore be described in the following. The first cassette mounting means 53, for example, includes a cassette stage 531 on which the first cassette 51 is mounted. The cassette stage 531 is moved in a vertical direction by an elevator not illustrated.

Cassette positioning members, not illustrated, whose external shape is in substantially a shape of an L in plan view, for example, are disposed at four corners of an upper surface of the cassette stage 531. The first cassette 51 is mounted on the upper surface of the cassette stage 531 such that corner parts on a lower surface side of the first cassette 51 are engaged with the cassette positioning members. Movement of the first cassette 51 in a horizontal plane direction is thereby limited, so that the first cassette 51 is prevented from being displaced.

Disposed in the vicinity of the first cassette 51 and the second cassette 52 is a first transfer robot 81 having functions of carrying a workpiece W before being coated with a resin out of the first cassette 51 and carrying the workpiece W after the coated resin is ground into the second cassette 52. The first transfer robot 81 is an articulated robot formed by coupling a plurality of arms to rotating means rotating the arms. The first transfer robot 81 has, at a leading end thereof, a robotic hand 810 that can suck and hold the workpiece W. The robotic hand 810 may be either of a type that comes into contact with the workpiece W and transmits a suction force to the workpiece W or of a type that can suck and hold the workpiece W in a noncontact manner by using Bernoulli's principle.

Disposed in a movable region of the first transfer robot 81 are positioning means 14 positioning the workpiece W before resin coating at a predetermined position and a cleaning apparatus 15 that cleans the workpiece W after the coated resin is ground.

The positioning means 14 centers the workpiece W carried onto a pedestal 140 by the first transfer robot 81 while correcting the position of the workpiece W by pushing an outer peripheral edge of the workpiece W by each contact pin 141 that moves so as to reduce a diameter while maintaining the position thereof on an identical circumference.

The cleaning apparatus 15 is, for example, a single wafer spinner cleaning apparatus. The cleaning apparatus 15 can retain, by a cleaning table not illustrated, the workpiece W after the coated resin is ground, the workpiece W having been conveyed by the first transfer robot 81, and clean the workpiece W on a one-by-one basis (remove a grinding swarf originating from the resin or the like) by jetting cleaning water to the resin of the retained workpiece W. Incidentally, the cleaning apparatus 15 may be a batch type cleaning apparatus that can clean a plurality of workpieces W at the same time.

A second transfer robot 82 is disposed in the vicinity of the positioning means 14. A third transfer robot 83 is disposed in the vicinity of the cleaning apparatus 15. The second transfer robot 82 conveys the workpiece W before resin coating which workpiece is centered by the positioning means 14 to a spinner table 20 of resin coating means 2 to be described later. In addition, the second transfer robot 82 conveys the workpiece W in a state of having a resin film cured by being subjected to ultraviolet light (UV) irradiation in resin curing means 4 from the spinner table 20 to a holding table 30 to be described later.

The second transfer robot 82, for example, includes: a suction pad 820 whose external shape is a disc shape and whose lower surface constitutes a sucking surface that sucks and holds the workpiece W; an arm 821 that extends in a horizontal direction and has the suction pad 820 fixed to a lower surface of a leading end of the arm 821; and arm moving means 822 turning the arm 821 in the horizontal direction about an axis in a Z-axis direction, the arm moving means 822 being connected to the arm 821. The arm 821 may, for example, be vertically movable in the Z-axis direction by the arm moving means 822.

The third transfer robot 83 conveys the workpiece W after the cured resin is ground by resin grinding means 6 illustrated in FIG. 1 from the holding table 30 to a cleaning table of the cleaning apparatus 15. The configuration of the third transfer robot 83 is similar to the configuration of the second transfer robot 82, and therefore, a description thereof will be omitted.

The resin coating means 2 coating the front surface Wa of the workpiece W with a resin, the resin coating means 2 being disposed in a movable range of the second transfer robot 82 on the base 10, is, for example, a spin coater (rotary coating means). The resin coating means 2 includes: the spinner table 20 which sucks and holds the workpiece W by a holding surface 20*a* formed of a porous member or the like; and a nozzle 21 that supplies a liquid resin to the front surface Wa of the workpiece W held on the spinner table 20. Incidentally, the periphery of the spinner table 20 is surrounded by a case not illustrated, and the spinner table 20 is thus configured so as not to scatter the liquid resin to surroundings during resin coating.

The nozzle 21 is, for example, erected on the side of the spinner table 20 and formed in a substantially L-shaped external shape as viewed from the side. A supply port formed at a leading end part of the nozzle 21 opens toward the holding surface 20*a* of the spinner table 20. The nozzle 21 can be turned about an axis in the Z-axis direction, and can thus move the supply port from above the spinner table 20 to a retracted position. The liquid resin supplied by the nozzle 21, for example, has a property of being cured by being irradiated with an ultraviolet ray of a predetermined wavelength. In addition, the liquid resin may for example have a property of becoming water-insoluble after curing.

The periphery of the spinner table 20 is surrounded by a cover 23. Rotating means 24 (see FIG. 2) including a motor and a rotary shaft or the like is disposed below the spinner table 20. The spinner table 20 can be rotated about an axis in the Z-axis direction by the rotating means 24. In addition, the spinner table 20 can be moved in a reciprocating manner in a Y-axis direction together with the cover 23 by a fourth transfer mechanism 84 as resin curing feeding and conveying means disposed below the cover 23.

Disposed on a rear side (+Y direction side) of the resin coating means 2 on the base 10 is the resin curing means 4 for curing the resin by applying an external stimulus (irradiation of the resin with UV in the present embodiment) to the resin with which the front surface Wa of the workpiece W is coated. The resin curing means 4 for example includes a UV irradiation chamber 40 having a box-shaped external shape. A lower side of a front side wall 40a of the UV irradiation chamber 40 illustrated in FIG. 1 is cut away in substantially a rectangular shape to form a carrying-in-and-out port 40b. The spinner table 20 is housed into the UV irradiation chamber 40 when the spinner table 20 passes through the carrying-in-and-out port 40b. The carrying-in-and-out port 40b of the front side wall 40a can be opened and closed by a shutter not illustrated.

As an example, a plurality of light sources of ultraviolet light (UV) such as low-pressure mercury UV lamps, light-emitting diode (LED) lighting, or the like that can apply an ultraviolet ray of a predetermined wavelength downward are arranged on an upper part within the UV irradiation chamber 40. After the spinner table 20 holding the workpiece W coated with a resin is housed into the UV irradiation chamber 40, the ultraviolet light is applied from the light source of the ultraviolet light to the front surface Wa of the workpiece W located below. The resin with which the front surface Wa is coated is thereby cured to form a resin film protecting the front surface Wa of the workpiece W.

Incidentally, as an example, the spinner table 20 may be formed of a transparent member such as glass or the like, and the light sources of the ultraviolet light may be disposed below the spinner table 20 within the UV irradiation chamber 40. In this case, the ultraviolet light is transmitted through the transparent spinner table 20 and applied to the coated resin from below.

The configuration of the resin curing means 4 is not limited to the example in the present embodiment. For example, in a case where the resin film with which the front surface Wa of the workpiece W is coated by the resin coating means 2 is formed of a thermosetting resin cured by heating, the resin curing means 4 may be configured to include a heater or an infrared lamp within a housing, and cure the coated resin film by applying heat to the coated resin film.

As illustrated in FIG. 1, the holding table 30 is movable in the Y-axis direction from a middle in a region on the −X direction side of the base 10 to the rear of the apparatus. The holding table 30, for example, has a circular external shape. The holding table 30 sucks and holds the workpiece W on an upper surface 300 (holding surface 300) formed of a porous member or the like and communicating with a suction source not illustrated. The holding table 30 is surrounded by a cover 31a. The holding table 30 is rotatable about an axis in the Z-axis direction, and is movable in a reciprocating manner in the Y-axis direction by Y-axis direction moving means (not illustrated) which is disposed below the cover 31a and a bellows cover 31b coupled to the cover 31a.

A column 17 is erected on the rear side on the base 10. Grinding feed means 7 for grinding-feeding the resin grinding means 6, the grinding feed means 7 being disposed at a front-side surface of the column 17, includes: a ball screw 70 having an axis in the Z-axis direction; a pair of guide rails 71 arranged in parallel with the ball screw 70; a motor 72 which is coupled to the ball screw 70 and rotates the ball screw 70; and a raising and lowering plate 73 which has an internal nut screwed into the ball screw 70 and has a side portion in sliding contact with the guide rails 71. As the motor 72 rotates the ball screw 70, the raising and lowering plate 73 is raised or lowered while guided by the pair of guide rails 71. The raising and lowering plate 73 supports the resin grinding means 6, so that the raising or lowering of the raising and lowering plate 73 raises or lowers the resin grinding means 6.

The resin grinding means 6 includes: a rotary shaft 60 whose axial direction is a vertical direction; a housing 61 that rotatably supports the rotary shaft 60; a motor 62 that rotation-drives the rotary shaft 60; a mount 63 attached to a lower end of the rotary shaft 60; and a grinding wheel 64 detachably connected to the mount 63. A plurality of grinding stones 641 in substantially a rectangular parallelepipedic shape are annularly arranged on a bottom surface of the grinding wheel 64. The grinding stones 641 are formed by fixing diamond abrasive grains or the like thereto by a predetermined bonding agent.

As an example, a flow passage not illustrated which communicates with a grinding water supply source and serves as a passage way for grinding water is formed within the rotary shaft 60 so as to penetrate in the axial direction of the rotary shaft 60. The flow passage opens in the bottom surface of the grinding wheel 64 so as to be able to jet the grinding water toward the grinding stones 641.

As illustrated in FIG. 1, thickness measuring means 19 measuring the thickness of the resin after grinding on the workpiece W held by the holding table 30 is disposed above a movement path of the holding table 30. The thickness measuring means 19 is, for example, a reflection type optical displacement sensor. The thickness measuring means 19 includes: a light projecting element irradiating the ground resin with which the front surface Wa of the workpiece W is coated with measurement light; and a light receiving element detecting reflected light reflected after being applied from the light projecting element to the resin.

The light projecting element of the thickness measuring means 19 irradiates the resin on the workpiece W positioned below the thickness measuring means 19 with the measurement light, and the light receiving element of the thickness measuring means 19 receives the reflected light. Then, an optical path difference is calculated between reflected light reflected on an upper surface of the resin and reflected light reflected on a lower surface of the resin after being transmitted through the resin, when the reflected light is received by the light receiving element. The thickness of the coated resin is measured from a principle of triangulation or the like on the basis of the calculated value. Incidentally, an index of refraction of the resin is necessary when the optical path difference is calculated. However, the index of refraction of the resin coated by the resin coating means 2 is a known parameter, and thus the calculation is performed without any problem.

Incidentally, the thickness measuring means 19 may be disposed at a position other than the position illustrated in FIG. 1, and a mode of the thickness measuring means 19 is not limited to that in the present embodiment. The thickness measuring means 19 may, for example, be configured to include a pair of contact type height measuring means (height gage). Specifically, the thickness measuring means 19 includes first height measuring means measuring a height of the holding surface 300 of the holding table 30 and second height measuring means measuring a height of the upper surface of the resin on the workpiece W held on the holding table 30. The first height measuring means and the second height measuring means include, at each end thereof, a contact that is raised and lowered in the vertical direction and comes into contact with each of the surfaces to be measured. Height measurement is performed in a state in which each of the contacts is pressed against each of the surfaces to be measured by an appropriate force. Such contact type thickness measuring means calculates a difference between the height of the upper surface of the resin after grinding on the workpiece W, the height being measured by the second height measuring means, and the height of the holding surface 300 of the holding table 30, the height being measured by the first height measuring means. The value of the difference is a sum of the thickness of the workpiece W and the thickness of the coated resin. Because the thickness of the workpiece W is known, the thickness measuring means 19 can calculate the thickness of the coated resin.

The processing apparatus 1, for example, includes control means 9 controlling the whole of the apparatus. The control means 9 includes a central processing unit (CPU) that performs arithmetic processing according to a control program and a storage element such as a memory or the like. The control means 9 is connected to the grinding feed means 7, the resin grinding means 6, and the like by wiring not illustrated. Then, under control of the control means 9, operation of each configuration of the resin grinding means 6 is controlled, such as rotating operation of the grinding wheel 64 in the resin grinding means 6, grinding feed operation in the Z-axis direction of the resin grinding means 6 by the grinding feed means 7, and the like.

The following description will be made of operation of the processing apparatus 1 when the front surface Wa of the workpiece W is coated with a film of a resin having a desired thickness by using the processing apparatus 1.

First, one workpiece W (assumed to be a first workpiece W) is carried out of a shelf of a lowermost layer, for example, within the first cassette 51 while sucked and held by the first transfer robot 81. Next, the first transfer robot 81 places the workpiece W on the pedestal 140 of the positioning means 14, and thereafter, the first transfer robot 81 separates from the workpiece W. Then, each contact pin 141 moves so as to reduce the diameter, and corrects the position of the workpiece W by pushing the outer peripheral edge of the workpiece W, so that the center of the workpiece W is positioned at the center of the pedestal 140.

After the center of the workpiece W is positioned on the positioning means 14, each contact pin 141 moves in a direction of increasing the diameter. Then, the workpiece W in the centered state is sucked and thereafter carried out by the second transfer robot 82. The second transfer robot 82 sucking and holding the workpiece W performs a turning movement, and thus conveys and mounts the workpiece W onto the holding surface 20a of the spinner table 20. After the workpiece W is sucked and held in a state in which the front surface Wa is oriented upward on the holding surface 20a of the spinner table 20, the second transfer robot 82 separates from the workpiece W, and retracts from the spinner table 20.

Figure 2:
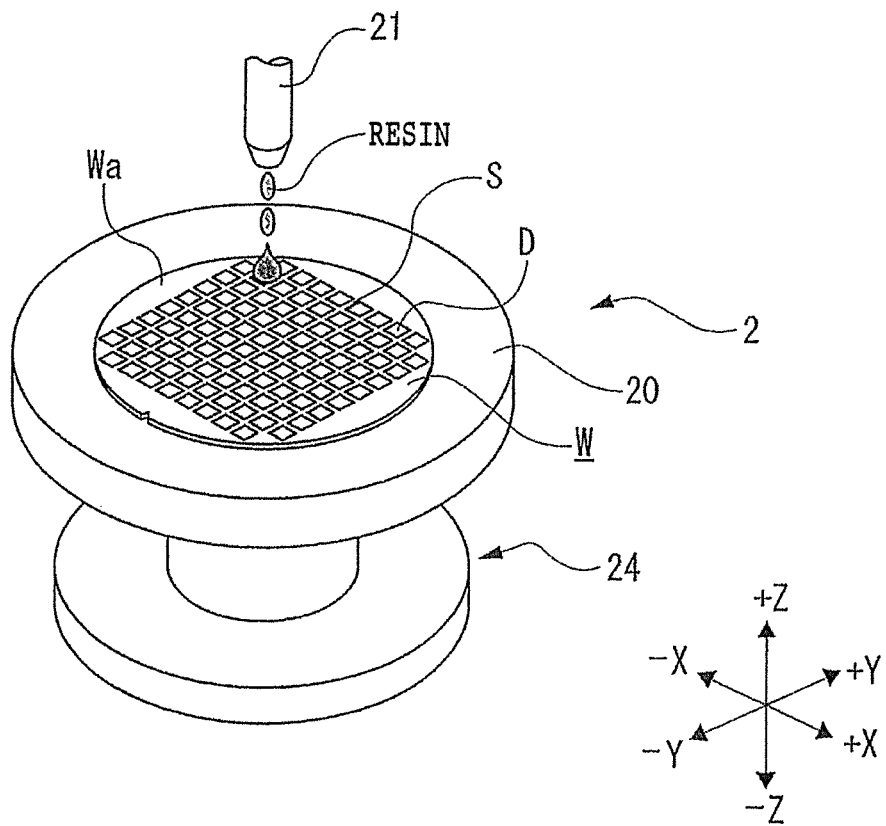
FIG. 2 is a perspective view illustrating a state in which resin coating means is coating the front surface of a workpiece with a resin.

Next, the nozzle 21 performs a turning movement, and as illustrated in FIG. 2, the supply port of the nozzle 21 is, for example, positioned above the center of the front surface Wa of the workpiece W. Then, the spinner table 20 is rotated by the rotating means 24 while a liquid resin is dropped from the nozzle 21 onto a central portion of the front surface Wa of the workpiece W sucked and held on the spinner table 20. The dropped liquid resin is spread by a centrifugal force from a central side of the front surface Wa of the workpiece W to an outer circumferential side of the front surface Wa of the workpiece W. The entire front surface Wa of the workpiece W is thereby coated with the resin.

The resin coating means 2 in the present embodiment thus coats the front surface Wa of the workpiece W with the resin by a spin coat method. However, there is no limitation to this. For example, the resin coating means 2 may coat the front surface Wa of the workpiece W with the resin by, for example, potting or spraying.

After a predetermined amount of resin is supplied to the front surface Wa of the workpiece W, and the front surface Wa is coated with a resin film of a predetermined thickness, the dropping of the liquid resin from the nozzle 21 is stopped. Incidentally, the thickness of the resin film is determined in consideration of the thickness of a part ground by the resin grinding means 6 illustrated in FIG. 1. Next, the fourth transfer mechanism 84 disposed below the cover 23 illustrated in FIG. 1 moves the spinner table 20 in the +Y direction, and conveys the spinner table 20 into the UV irradiation chamber 40 of the resin curing means 4. The shutter, not illustrated, of the UV irradiation chamber 40 is opened, and the spinner table 20 is passed through the carrying-in-and-out port 40b, and carried into the UV irradiation chamber 40. The shutter is thereafter closed. A resin film J (see FIG. 3) is cured by irradiating the resin film of the workpiece W sucked and held on the spinner table 20 with UV of a predetermined wavelength within the UV irradiation chamber 40.

After the resin film J of the workpiece W is irradiated with the UV for a predetermined time, the fourth transfer mechanism 84 moves the spinner table 20 in the −Y direction, and carries the spinner table 20 out of the resin curing means 4. After the spinner table 20 is positioned within the movable region of the second transfer robot 82, the second transfer robot 82 sucks the workpiece W and carries the workpiece W out of the spinner table 20. For example, the second transfer robot 82 sucking and holding the resin film J of the workpiece W performs a turning movement, conveys the workpiece W onto the holding surface 300 of the holding table 30, and places the workpiece W with the resin film J oriented upward. After the workpiece W is sucked and held on the holding surface 300 of the holding table 30, the second transfer robot 82 separates from the workpiece W.

Figure 3:
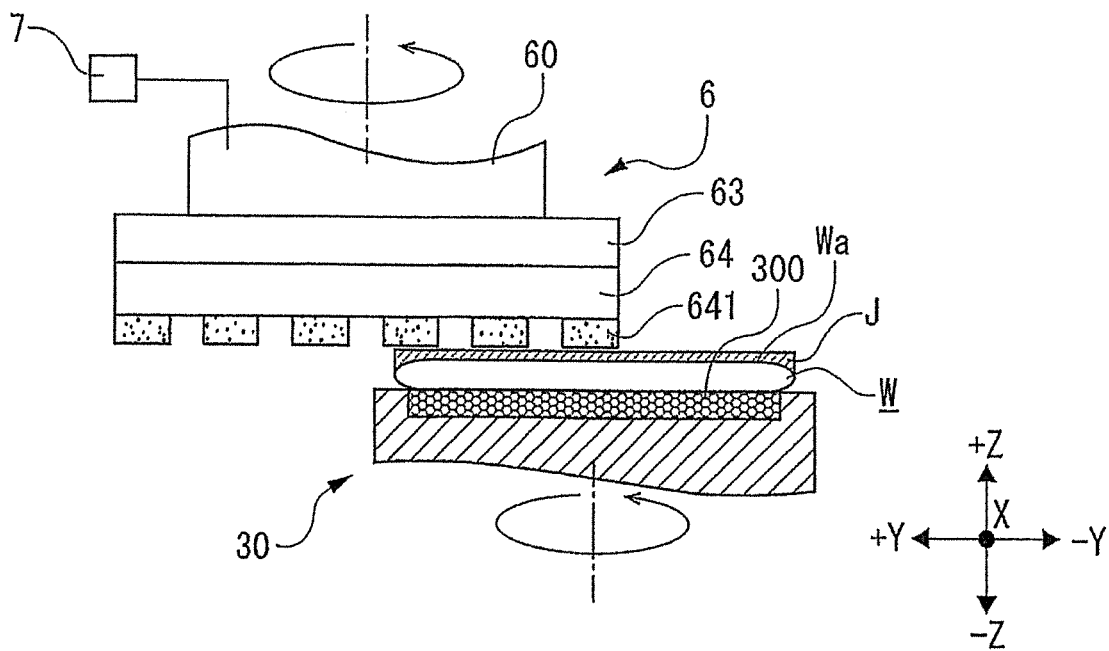
FIG. 3 is a cross-sectional view illustrating a state in which a cured resin is being flattened by being ground by rotating grinding stones.

The holding table 30 holding the workpiece W moves in the +Y direction to a position below the resin grinding means 6. As illustrated in FIG. 3, a rotational center of the grinding wheel 64 is positioned so as to be displaced in the +Y direction by a predetermined distance with respect to the rotational center of the workpiece W, and a rotational trajectory of grinding stones 641 is positioned so as to pass through the rotational center of the workpiece W. The grinding wheel 64 is rotated as the motor 62 illustrated in FIG. 1 rotation-drives the rotary shaft 60. In addition, the resin grinding means 6 is fed in the −Z direction by the grinding feed means 7 illustrated in FIG. 3, and the grinding stones 641 of the rotating grinding wheel 64 abut against the upper surface of the cured resin film J. Grinding is thereby performed. In addition, as the holding table 30 is rotated, the workpiece W held on the holding surface 300 is also rotated, so that the entire upper surface of the resin film J is ground and becomes flat. As an example, during grinding, grinding water is supplied to contact parts of the grinding stones 641 and the resin film J through the flow passage within the rotary shaft 60 to cool and clean the contact parts.

After the resin film J is ground by a predetermined amount by the grinding stones 641, the grinding feed means 7 raises the resin grinding means 6 and separates the resin grinding means 6 from the workpiece W. Further, the thickness measuring means 19 measures the thickness of the resin film J after the grinding on the holding table 30 whose rotation is stopped. The thickness measuring means 19 sends information about the thickness of the workpiece W (first workpiece W) to the memory of the control means 9. The control means 9 stores the information.

The holding table 30 sucking and holding the workpiece W after the thickness is measured by the thickness measuring means 19 is moved in the −Y direction, and positioned within the movable region of the third transfer robot 83. The third transfer robot 83 then sucks the workpiece W and carries the workpiece W out of the holding table 30. Then, the third transfer robot 83 sucking and holding the resin film J of the workpiece W performs a turning movement, and carries the workpiece W into the cleaning apparatus 15.

After the ground surface of the resin film J of the workpiece W is cleaned in the cleaning apparatus 15, the first transfer robot 81 carries the workpiece W out of the cleaning apparatus 15, and carries the workpiece W onto a shelf in the second cassette 52. The control means 9 then stores the previously stored thickness of the resin film J of the first workpiece W and the number of the shelf within the second cassette 52 in which the first workpiece W is housed in association with each other.

Thus, the processing apparatus 1 according to the present invention includes: the first cassette 51 housing a plurality of workpieces W and mounted on the first cassette mounting means 53, and the second cassette 52 housing a plurality of workpieces W and mounted on the second cassette mounting means 54; the resin coating means 2 coating the front surface Wa of a workpiece W with a resin; the resin curing means 4 curing the resin by applying an external stimulus (irradiation of UV in the present embodiment) to the coated resin; the resin grinding means 6 flattening the cured resin by grinding the cured resin by the grinding stones 641 that are rotating; and the first transfer robot 81, the second transfer robot 82, the third transfer robot 83, and the fourth transfer mechanism 84 that convey the workpiece between the means. It is therefore possible to make the thickness of the coated resin film J a desired thickness and flatten the exposed surface (ground surface) of the resin film J with high precision only within the processing apparatus 1 according to the present invention.

Thereafter, as in the formation of the resin film J whose thickness is controlled on the above-described first workpiece W, the first transfer robot 81 carries the workpieces W housed in the first cassette 51 in order out of a lower shelf to perform resin coating, the curing of the coated resin film, the grinding of the resin film, and the cleaning of the resin film. The workpieces W coated with the resin film are housed into the second cassette 52 in order from a lower shelf, for example. In addition, the number of the respective shelves within the second cassette 52 and the measured thickness value of the resin films of the workpieces W housed in the shelves are associated with each other and stored in order by the control means 9.

When the resin coating, the curing of the coated resin film, the grinding of the resin film, and the cleaning of the resin film are thus performed for, for example, all of the workpieces W within the first cassette 51, and the workpieces W coated with the resin are housed into all of the shelves of the second cassette 52, the second cassette 52 is conveyed to a grinding apparatus in a next process by conveying means not illustrated or the like.

The grinding apparatus sucks and holds the resin film side of a workpiece W in the next process by a holding table, and thins the workpiece W to a predetermined thickness by grinding a back surface Wb of the workpiece W held by the holding table by a rotating grinding wheel. As an example, the control means 9 of the processing apparatus 1 is electrically connected to the grinding apparatus in the next process via wiring. The control means 9 transmits, to control means of the grinding apparatus, information about the previously stored numbers of the respective shelves within the second cassette 52 and the previously stored measured thickness values of the resin films of the respective workpieces W housed in the shelves. Therefore, in the grinding apparatus in the next process, an appropriate setting of a grinding feed position of grinding means or the like can be made by using the transmitted information about the measured thicknesses of the resin films of the workpieces W. It is therefore possible to improve precision of a finished thickness after grinding of the workpiece W.

It is to be noted that the processing apparatus 1 according to the present invention is not limited to the foregoing embodiment, and that the shape or the like of each configuration of the apparatus illustrated in the accompanying drawings is not limited thereto either, but can be changed as appropriate within a range in which effects of the present invention can be exerted.

For example, while the first transfer robot 81, the second transfer robot 82, and the third transfer robot 83 in the present embodiment are conveying means that suck and hold the workpiece W by a suction force, the first transfer robot 81, the second transfer robot 82, and the third transfer robot 83 may be, for example, edge clamp type conveying means that convey the workpiece W while holding the outer peripheral edge of the workpiece W by a plurality of holding pawls capable of diameter reduction in a radial direction.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece processing apparatus which coats a front surface of a workpiece with a resin, the workpiece having a device formed in each of regions demarcated by a plurality of planned dividing lines, the workpiece processing apparatus comprising:
   a cassette including a plurality of shelves formed therewithin and housing a plurality of workpieces, said cassette is mounted on a cassette mounting means;
   a spinner table surrounded by a cover and a first conveying means below said cover, said spinner table configured to hold the workpiece;
   a second conveying means that transfers the workpiece between the cassette and the spinner table;
   a resin coating means configured for coating the front surface of the workpiece with the resin;
   a resin curing means including a chamber having an external stimulus, the workpiece on said spinner table being reciprocably movable between said resin coating means and within said chamber of said resin curing means using said first conveying means, said resin curing means curing the resin on the workpiece by applying the external stimulus to the resin on the front surface of the workpiece to provide a cured coated resin on the front surface of the workpiece;
   a resin grinding means including a rotating grinding stone that flattens the cured coated resin by grinding a portion of the cured coated resin such that a portion of the cured resin remains on the front surface of the workpiece after grinding;
   a thickness measuring means including a chuck table that holds the workpiece with the cured coated resin, wherein the thickness measuring means measures a thickness of the cured coated resin on the workpiece after the cured coated resin is ground by the resin grinding means and provides a measured thickness of the cured coated resin, and transmits the measured thickness of the cured coated resin to a control means;

a grinding apparatus in the next process that grinds a back surface of the workpiece to a predetermined thickness based on the measured thickness of the cured coated resin on the front surface; and the control means controlling operations of the workpiece processing apparatus, wherein the control means stores a number associated with each of the plurality of shelves within the cassette and the measured thickness value of the cured coated resin of the workpieces housed in each of the plurality of shelves and transmits, the number associated with each of the plurality of shelves within the cassette and the measured thickness value of the cured coated resin of the respective workpiece housed in each of the plurality of shelves to the grinding apparatus.

2. The workpiece processing apparatus according to claim 1, wherein the resin coating means coats the front surface of the workpiece with the resin by a spin coating method.

3. The workpiece processing apparatus according to claim 1, wherein said thickness measuring means includes a light projecting element and a light detecting element, said light projecting element directs light at an upper surface of the cured coated resin on the workpiece and through the cured coated resin to a lower surface of the cured coated resin and said light detecting element receives reflected light from the upper surface and the lower surface of the cured coated resin, and said thickness measuring means calculates an optical path difference to determine the thickness of the cured coated resin.

4. The workpiece processing apparatus according to claim 1, wherein the thickness measuring means includes a first height measuring means that measuring a holding surface of a holding table for the workpiece, and a second height measuring means that measures an upper surface of the cured coated resin on the workpiece.

5. The workpiece processing apparatus according to claim 1, wherein said first height measuring means and said second height measuring means each include a contact that is raised and lowered relative to the workpiece, wherein the contact of said first height measuring means contacts the holding surface, and the contact of the second height measuring means contacts the upper surface of the cured coated resin.

6. The workpiece processing apparatus according to claim 1, further comprising a cleaning apparatus configured for cleaning a ground surface of the cured coated resin on the workpiece.

7. The workpiece processing apparatus according to claim 1, wherein the resin curing means includes a plurality of light sources of ultraviolet light that emit ultraviolet light rays of a predetermined wavelength on the workpiece to provide the cured coated resin on the front surface of the workpiece.

* * * * *